(12) United States Patent
Huston et al.

(10) Patent No.: US 8,216,374 B2
(45) Date of Patent: Jul. 10, 2012

(54) GAS COUPLER FOR SUBSTRATE PROCESSING CHAMBER

(75) Inventors: Joel Huston, San Jose, CA (US); Jeffery Tobin, Mountain View, CA (US); Christophe Marcadal, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1116 days.

(21) Appl. No.: 11/614,074

(22) Filed: Dec. 20, 2006

(65) Prior Publication Data

US 2007/0144436 A1    Jun. 28, 2007

Related U.S. Application Data

(60) Provisional application No. 60/753,784, filed on Dec. 22, 2005.

(51) Int. Cl.
| | |
|---|---|
| C23C 16/00 | (2006.01) |
| C23C 16/50 | (2006.01) |
| C23F 1/00 | (2006.01) |
| H01L 21/306 | (2006.01) |

(52) U.S. Cl. .................. 118/715; 156/345.1; 156/345.33
(58) Field of Classification Search ............. 137/625.43, 137/625.48, 625.68, 884; 251/31, 367, 368; 118/715

See application file for complete search history.

(56) References Cited

U.S. PATENT DOCUMENTS

| | | | | |
|---|---|---|---|---|
| 3,020,927 | A | * | 2/1962 | McLaughlin ............ 137/625.68 |
| 3,862,740 | A | * | 1/1975 | Gallagher et al. ............ 251/305 |
| 4,714,091 | A | | 12/1987 | Wagner |
| 5,605,179 | A | * | 2/1997 | Strong et al. .................. 137/884 |
| 5,836,355 | A | * | 11/1998 | Markulec et al. ............. 137/884 |
| 5,975,590 | A | | 11/1999 | Cowan et al. |
| 6,063,196 | A | | 5/2000 | Li et al. |
| 6,110,556 | A | | 8/2000 | Bang et al. |
| 6,123,773 | A | | 9/2000 | Sajoto et al. |
| 6,125,887 | A | | 10/2000 | Pinto |
| 6,187,133 | B1 | | 2/2001 | Knoot |
| 6,193,836 | B1 | | 2/2001 | Mohn et al. |
| 6,251,187 | B1 | | 6/2001 | Li et al. |

(Continued)

FOREIGN PATENT DOCUMENTS

WO    WO 2005024928 A1 *    3/2005

OTHER PUBLICATIONS

International Searching Authority, International Search Report, Oct. 25, 2007, Alexandria, Virginia US. PCT/US 06/49151.

*Primary Examiner* — Maureen Gramaglia
*Assistant Examiner* — Tiffany Nuckols
(74) *Attorney, Agent, or Firm* — Ashok K. Janah; Janah & Associates, P.C.

(57) ABSTRACT

A gas coupler is capable of conducting gas between a gas component, gas source and substrate processing chamber. The gas coupler comprises a metal block comprising a gas component seating surface having a plurality of gas component coupling ports. The block also has a plurality of sidewalls at right angles to the gas component seating surface, each sidewall comprising a counterbored gas orifice. A plurality of right-angled internal passageways are each connected to a gas component coupling port. Each internal passageway terminates at counterbored gas orifice on a different sidewall surface so that each gas component coupling port is fluidly connected to a different sidewall.

20 Claims, 3 Drawing Sheets

U.S. PATENT DOCUMENTS

| | | |
|---|---|---|
| 6,395,643 B1 | 5/2002 | Knoot |
| 6,477,980 B1 | 11/2002 | White et al. |
| 6,523,563 B2 | 2/2003 | Cho et al. |
| 6,830,624 B2 | 12/2004 | Janakiraman et al. |
| 6,913,652 B2 | 7/2005 | Shan |
| 6,916,398 B2 | 7/2005 | Chen et al. |
| 7,066,194 B2 | 6/2006 | Ku et al. |
| 7,204,155 B2 | 4/2007 | Lane et al. |
| 7,228,873 B2 | 6/2007 | Ku et al. |
| 7,431,772 B2 | 10/2008 | Murugesh et al. |
| 7,484,473 B2 | 2/2009 | Keller et al. |
| 7,510,624 B2 | 3/2009 | Liang et al. |
| 7,572,337 B2 | 8/2009 | Rocha-Alvarez et al. |
| 7,588,957 B2 | 9/2009 | White |
| 7,628,863 B2 | 12/2009 | Sen et al. |
| 2003/0037879 A1 | 2/2003 | Askarinam et al. |
| 2003/0129106 A1 | 7/2003 | Sorensen et al. |
| 2003/0224615 A1 | 12/2003 | Nishino et al. |
| 2004/0050492 A1 | 3/2004 | Tsuei et al. |
| 2004/0118345 A1 | 6/2004 | White et al. |
| 2004/0129311 A1 | 7/2004 | Courtney |
| 2006/0113038 A1 | 6/2006 | Gondhalekar et al. |
| 2006/0270221 A1 | 11/2006 | M'Saad et al. |
| 2007/0022954 A1* | 2/2007 | Iizuka et al. .................. 118/724 |
| 2007/0084408 A1 | 4/2007 | Yudovsky et al. |
| 2007/0259112 A1 | 11/2007 | Ishikawa et al. |
| 2008/0000530 A1 | 1/2008 | Sun et al. |
| 2008/0124944 A1 | 5/2008 | Park et al. |
| 2008/0185018 A1 | 8/2008 | Mimken et al. |
| 2008/0216747 A1 | 9/2008 | Wieder et al. |
| 2008/0230518 A1 | 9/2008 | Brillhart et al. |
| 2009/0120364 A1 | 5/2009 | Suarez et al. |
| 2009/0159213 A1 | 6/2009 | Bera et al. |
| 2009/0162262 A1 | 6/2009 | Bera et al. |
| 2009/0163042 A1 | 6/2009 | Tseng et al. |
| 2009/0179085 A1 | 7/2009 | Carducci et al. |
| 2009/0236447 A1 | 9/2009 | Panagopoulos et al. |
| 2009/0272492 A1 | 11/2009 | Katz et al. |
| 2009/0283039 A1 | 11/2009 | White et al. |
| 2009/0294439 A1 | 12/2009 | Lai et al. |

* cited by examiner

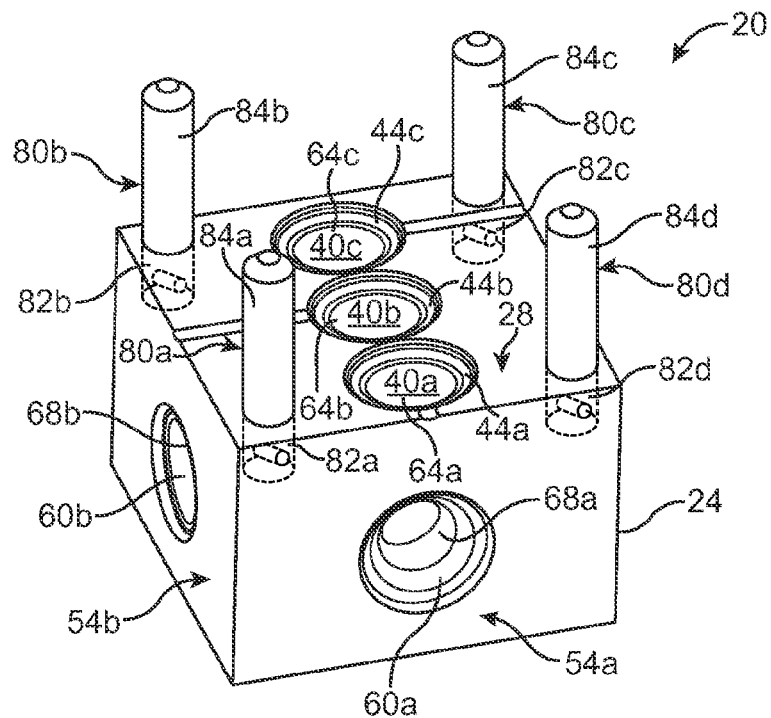
FIG. 3
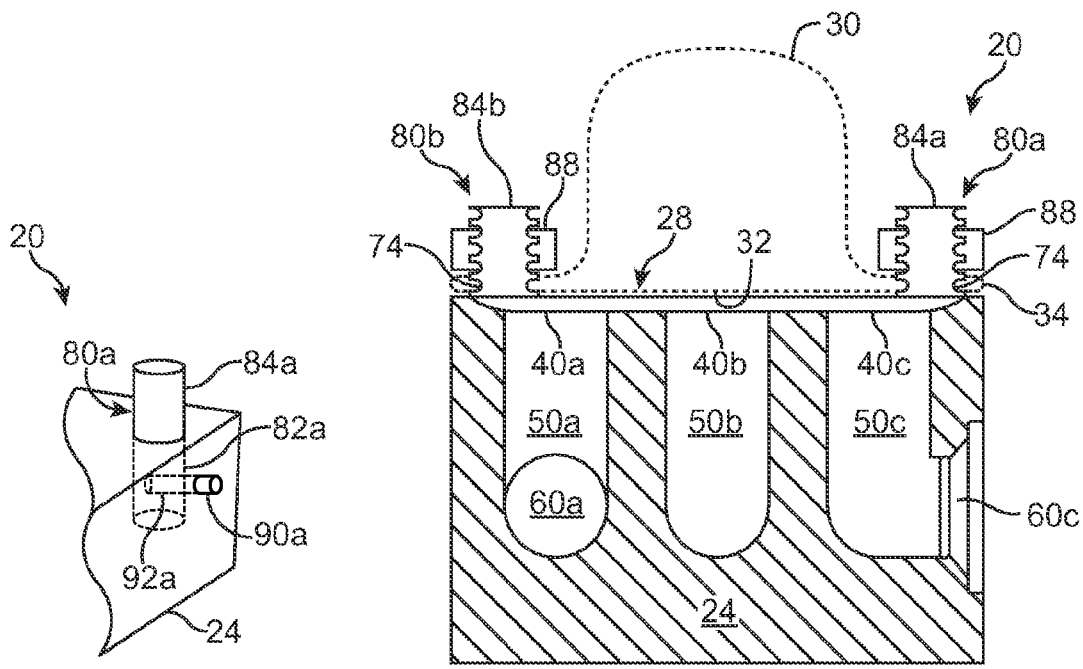
FIG. 5
FIG. 4

GAS COUPLER FOR SUBSTRATE PROCESSING CHAMBER

CROSS-REFERENCE

The present application claims priority from U.S. Provisional Application No. 60/753,784 filed on Dec. 22, 2005, which is incorporated by reference herein and in its entirety.

BACKGROUND

One or more embodiments of the present invention relate to a gas coupler for connecting gas components and pipes to a substrate processing chamber.

In the processing of substrates for the fabrication of semiconductors, displays, and electronic circuits, materials are formed on a substrate by, for example, oxidation, nitridation, ion implantation, chemical vapor deposition (CVD), and physical vapor deposition (PVD) processes. The substrates can be semiconducting wafers or dielectric displays. In chemical vapor deposition processes, a deposition gas is introduced into a chamber and energized by heat and/or RF energy to deposit a film on the substrate. In atomic layer deposition (ALD) processes, monolayers of atoms are deposited on a substrate to form elemental or compound layers by CVD type processes. In PVD, a target is sputtered to deposit layers of target material on the substrate. In etching processes, a patterned mask comprising a photoresist or hard mask, is formed on the substrate surface by lithography, and the substrate surface exposed between the mask features are etched by an energized gas to form features, such as interconnect lines, gates and barriers. The deposition and etching processes, and additional planarization processes, are conducted in sequence to process the substrate to fabricate integrated and other electronic circuits.

In such fabrication processes, a gas delivery system is used to deliver a process gas to the substrate processing chamber. The process gas can contain gases which are corrosive or hazardous, thus, the gas connection joints of the gas delivery system should be entirely sealed from the fabrication lab environment. The gas delivery system should also be able to transport gases supplied from process gas canisters which often contain these gases at high pressures, without leakage from the gas connection joints.

The gas delivery systems use gas couplers to couple gas components to gas pipes leading from the gas source to the gas component or from the gas component to the process chamber. The gas components can be, for example, gas pipes, gas valves, check valves, stopcocks, mass flow controllers, volume flow controllers or pressure regulators, any of which can be connected to gas pipes. The gas couplers have to be sufficiently strong to withstand the pressure of the gases passing through its internal conduits and external joints without excessive leakage. The gas coupler should also be able to form properly sealed joints with external gas pipes and the connected gas components to prevent leakage of gas from the joints. It is also desirable to be able to easily fabricate the gas coupler using conventional fabrication processes.

DRAWINGS

These features, aspects and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

FIG. 3 is another perspective view of the gas coupler of FIG. 1 showing posts extending from the top surface;

FIG. 4 is a side sectional view of the gas distributor of FIG. 3;

FIG. 5 is a perspective view of a portion of the gas coupler of FIG. 3 showing a lock pin in a post.

DESCRIPTION

Figure 1:
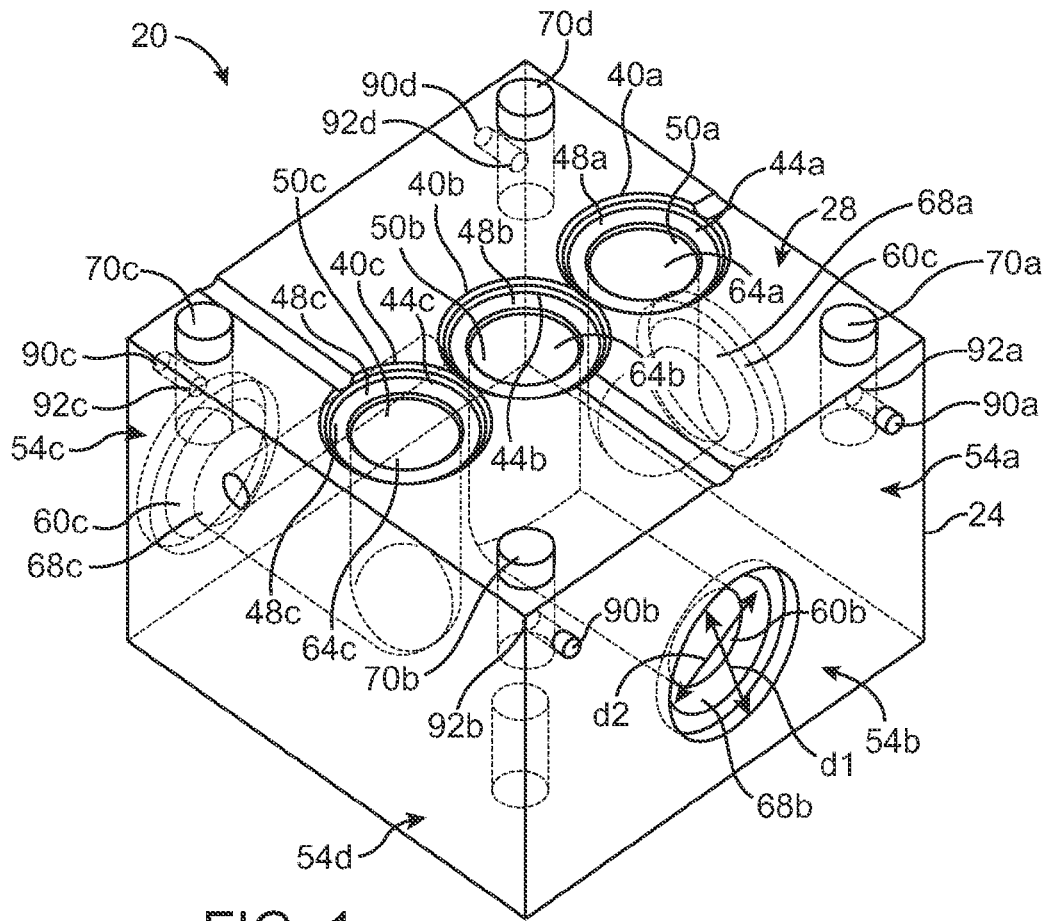
FIG. 1 is a perspective view of an embodiment of a gas coupler according to the present invention showing internal pathways as dashed lines.

An exemplary embodiment of a gas coupler 20 to conduct gas between a gas component, gas source and substrate processing chamber, is illustrated in FIG. 1. The gas coupler 20 comprises a metal block 24 having a body strong enough to withstand gas pressures and configured to be joined to a gas component and coupled by welding to gas pipes to form tightly sealed joints. The metal block 24 is a unitary body that can be rectangular in shape with six planar surfaces. The body of the metal block 24 can be composed of, for example, stainless steel, aluminum or copper. In one version, the metal block 24 is made of a low carbon content, low sulfur content steel, for example, 316LSQ steel from Carpenter Steel. The metal block 24 can also be made from other materials that are sufficiently strong to withstand a gas pressure of, for example, $20 \times 10^4$ psi.

The metal block 24 comprises a gas component seating surface 28, such as for example, the top surface, and which is provided to seat a gas component 30, shown in a dashed outline in FIG. 4. The seating surface 28 of the gas coupler 20 is shaped to match the shape or contour of the surface 32 of a mounting base 34 which may be flat, as shown, or a convoluted shape. It can also be polished smooth to form a tightly fitted interface with the mounting base of the gas component.

The seating surface 28 comprises a plurality of gas component coupling ports 40, for example, the first, second and third coupling ports 40a-c, respectively, as shown in FIG. 1. Each coupling port 40a-c couples to corresponding inlet port (not shown) of the gas component 30, or they can each couple to a port of separate gas components (not shown). In the version shown, each coupling port 40a-c comprises a recessed inner ledge 44a-c. A metal sealing gasket 48a-c is seated on the recessed inner ledges 44a-c of the coupling ports 40a-c. Each of the sealing gaskets 48a-c has an outer diameter sized to fit onto the recessed inner ledge 44a-c and an inner diameter sufficiently large to match the inner diameter of an internal passageway 50a-c in the metal block 24.

The metal block 24 also has a plurality of sidewall surfaces 54a-d which are substantially at right angles to the gas component seating surface 28 and orthogonal to one another. One or more of the sidewall surfaces 54a-c comprise a counterbored gas orifice 60a-c which can be connected to a gas pipe (not shown) or to a port of another gas component (also not shown), or connected to combinations of interconnected gas pipes and components. In one version, as shown in FIG. 1, the counterbored gas orifices 60a-c each comprise a first inner diameter $d_1$ and second inner diameter $d_2$, the second inner diameter $d_2$ being sufficiently smaller than the first inner diameter $d_1$ to seat an external gas pipe such that the external diameter of the gas pipe can be fillet welded to a sidewall surface 54a-c. For example, the second inner diameter $d_2$ can be a diameter that is at least about 5% smaller than the first inner diameter $d_1$.

In one version, the sidewall surface 54d is a solid and continuous surface which is absent a counterbored gas orifice. The solid sidewall surface 54d is useful to, for example, mate with a corresponding flat surface of an external wall of an enclosure that houses the gas coupler 20 and other components of the gas delivery system. The solid sidewall surface 54d can also easily mate with an overlapping edge of the gas component 30 received on the gas coupler 20 to orient the gas component in a fixed direction relative to the gas coupler 20.

Figure 2:
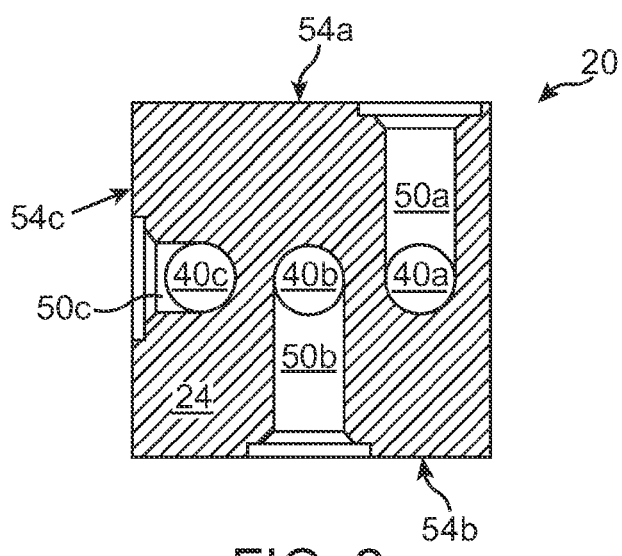
FIG. 2 is a top sectional view of the gas distributor of FIG. 1.
Figure 6:
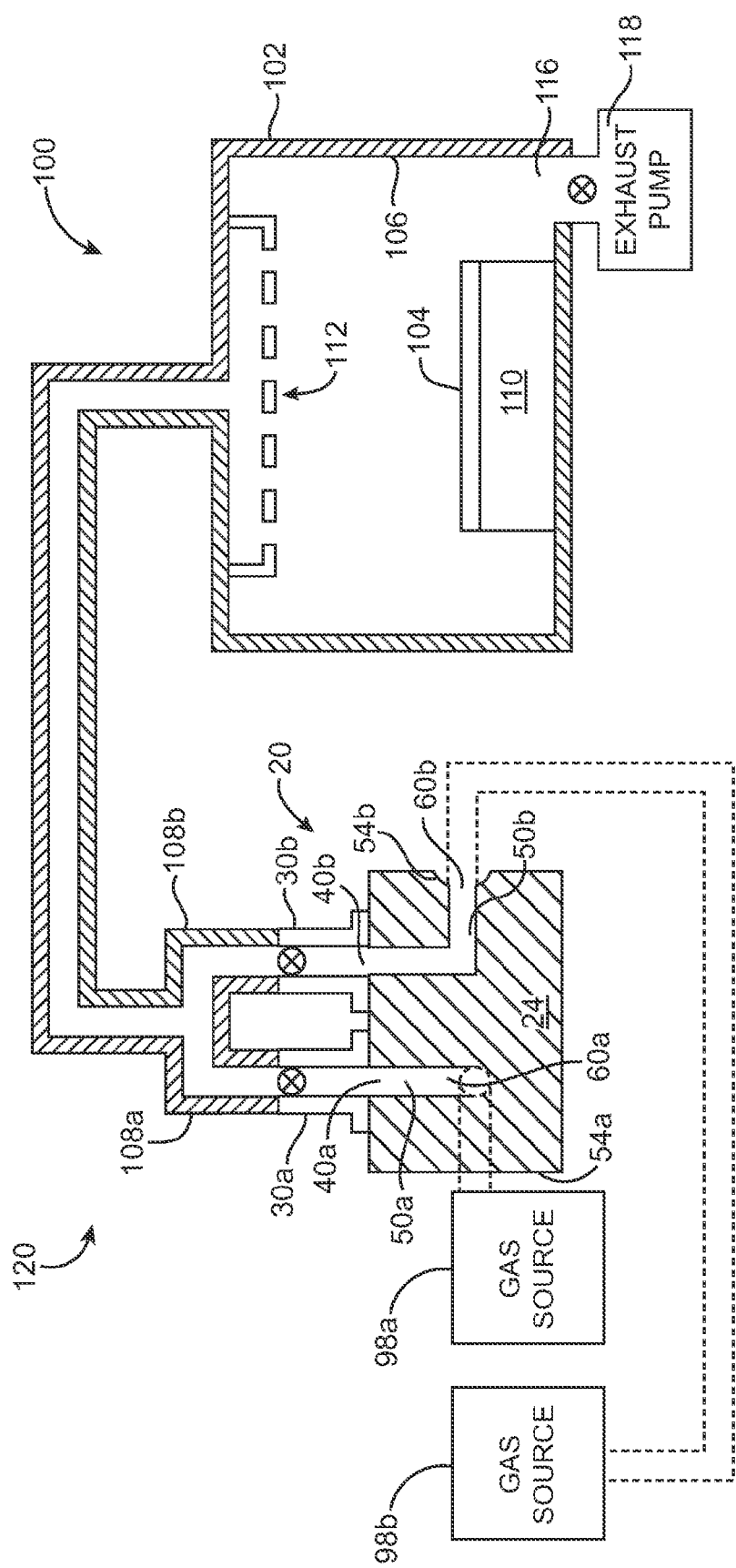
FIG. 6 is a schematic diagram showing a gas coupler connecting gas sources to a process chamber of a substrate processing apparatus.

The metal block 24 also has a plurality of internal passageways which terminate on orthogonal surfaces, such as for example, the first, second and third right-angled internal passageways 50a-c, as shown in FIG. 2. The internal passageways 50a-c are machined into the block using conventional machining methods, for example, drilling (or milling) a first bore perpendicular to a surface for a first drilling distance, followed by drilling a second bore through an orthogonal surface a second distance to join to the first bore to form a segmented passageway 50a-c with interconnected right angled bores. In one version, the internal passageways 50a-c comprise electropolished surfaces to allow gas to pass through the internal passages with reduced sticking of gas molecules to the polished surfaces than that which would occur on a rough or unfinished surface.

Each internal passageway 50a-c comprises a first end 64a-c connected to a gas component coupling port 40a-c and a second end 68a-c terminating at a counterbored gas orifice 60a-c on a sidewall surface. The internal passageways 50a-c are arranged in the metal block 24 such that each of the gas component coupling ports 40a-c can be fluidly connected to a different sidewall 54a-c. The counterbored gas orifices 60a-c on the different sidewalls 54a-c allow other gas components or gas pipes to be joined at orthogonal planes or directions to the gas coupler 20. This presents a distinct advantage of the coupler 20 in that a particular sidewall 54a-c can be tailored to mate with a gas pipe coming from a gas source or leading to the process chamber, along a particular direction. This allows the gas pipes coming to or from the gas coupler 20 to be oriented in the direction most suitable for connection to a gas source, process chamber, or even another gas component 30 and gas pipe.

The gas component seating surface 28 can also have a plurality of threaded holes 70a-d that mate with corresponding coupling holes 74 of a mounting base 34 of a gas component 30 to allow attachment of the gas component to the seating surface 28. For example, four or more holes 70a-d can be and positioned at the four corners of the metal block 24. The gas component 30 can be attached to the gas coupler 20 by conventional screws, bolts, or even an adhesive. Optionally, a rubber gasket with corresponding through holes can be placed in between the mounting base 34 of the gas component 30 and the seating surface 28 of the gas coupler 20 to form a better seal around the gas component coupling ports 40a-c.

In one version, as shown in FIG. 3, a plurality of posts 80a-d are positioned in a spaced apart arrangement on the seating surface 28 that is suitable to mate with gas component coupling holes 74 of a gas component 30 to hold the component to the gas coupler 20. The posts 80a-d each have a first end 82a-d that engages the threaded holes 70a-d of the seating surface 28 of the gas coupler 20, and a second end 84a-d that is size to pass through the coupling holes 74 of the gas component 30 to attach the gas component to the seating surface 28. The first end 82a-d of the posts 80a-d can be threaded to engage the threaded holes 70a-d of the seating surface 28. The second end 84a-d of the posts 80a-d can also be threaded so that when they are passed through the coupling holes 74 in the gas component 30, a corresponding nut 88 can be screwed onto the portion of the second end 84a-d that extends above the mounting base 34 of the gas component 30, as shown in FIG. 4. The first and second ends 82a-d and 84a-d, can also be threaded with reverse threads to facilitate locking the nut 88 onto the posts 80a-d without unscrewing the posts from the threaded holes 70a-d.

In yet another version, a locking pin 90a-d can be inserted in a hole 92a-d in each of the posts 80a-d to lock the post in the metal block 24, as shown in FIG. 5. The locking pin 90a-d can be made of the same metal as the posts 80a-d, for example, stainless steel.

The gas coupler 20 is useful for connecting gas components 30 and/or gas pipes 108 for a gas delivery system 120 that delivers gas to a process chamber 102 of a conventional substrate processing apparatus 104. The process chamber 102 typically comprises enclosed chamber walls 106 to maintain a vacuum, low-pressure or high-pressure environment around a substrate 104 during processing of the substrate 104. In the chamber 102, the substrate 104 rests on a substrate support 110, which can be a pedestal or electrostatic chuck. The gas delivery system 120 provides process gas to a gas distributor 112, which distributes the process gas in the chamber 102. The chamber 102 further comprises a gas exhaust port 116 to exhaust gas from the chamber 102 using one or more gas pumps 118.

The present invention has been described with reference to certain preferred versions thereof; however, other versions are possible. For example, the metal block of the gas coupler can have other shapes, such as triangular, spherical, or even polyhedral shapes, as would be apparent to one of ordinary skill for a particular application. The gas component coupling ports and counterbored gas orifices can also be positioned along different surfaces of the metal block. Therefore, the spirit and scope of the appended claims should not be limited to the description of the preferred versions contained herein.

What is claimed is:

1. A gas coupler to conduct gas between a gas component, gas source and substrate processing chamber, the gas coupler comprising:
   a unitary metal block comprising:
   (a) a gas component seating surface having first, second, and third gas component coupling ports, each gas component coupling port comprising a recessed inner ledge;
   (b) first, second, and third sidewall surfaces at right angles to the gas component seating surface, each sidewall surface comprising a single counter-bored gas orifice; and
   (c) first, second, and third internal passageways that are each connected to a single gas component coupling port, each internal passageway comprising an electropolished surface and terminating at a single counter-bored gas orifice on a different sidewall surface, whereby each gas component coupling port is fluidly connected to a different sidewall surface.

2. A gas coupler according to claim 1 wherein the gas component seating surface further comprises a plurality of threaded holes that mate with gas component coupling holes of a gas component to allow attachment of the gas component to the gas component seating surface.

3. A gas coupler according to claim 2 further comprising threaded posts that engage the threaded holes and pass through the gas component coupling holes of the gas component to attach the gas component to the gas component seating surface.

4. A gas coupler according to claim 1 wherein the counter-bored gas orifices each comprise first and second inner diameters, the second inner diameter being sufficiently smaller than the first inner diameter to seat an external gas pipe.

5. A gas coupler according to claim 4 wherein the second inner diameter comprises a diameter that is at least about 5% smaller than the first inner diameter.

6. A gas coupler according to claim 1 further comprising a sidewall at right angles to the gas component seating surface that is a solid surface and absent a counter-bored gas orifice.

7. A gas coupler according to claim 1 wherein the unitary metal block comprises stainless steel.

8. A substrate processing apparatus comprising a substrate processing chamber having enclosed chamber walls, a substrate support, a gas distributor, and a gas exhaust, the gas distributor being capable of receiving a process gas from a gas pipe connected to the gas coupler of claim 1.

9. A gas coupler to conduct gas between a gas component, gas source and substrate processing chamber, the gas coupler comprising:
a unitary metal block comprising:
 (a) a gas component seating surface having first, second, and third gas component coupling ports, each gas component coupling port comprising a recessed inner ledge;
 (b) first, second, and third sidewall surfaces (i) that are orthogonal to one another and at right angles to the gas component seating surface and (ii) that each comprise a single counter bored gas orifice;
 (c) a plurality of internal passageways that each connect to a single gas component coupling port and terminate at a single counter-bored gas orifice, each internal passageway comprising an electropolished surface; and
 (d) at least one metal seal gasket on a recessed inner ledge of a gas component coupling port.

10. A gas coupler according to claim 9 further comprising a sidewall surface that is:
 (a) at right angles to the gas component seating surface;
 (b) orthogonal to the other sidewall surfaces; and
 (c) absent a counter-bored gas orifice.

11. A gas coupler according to claim 9 further comprising a plurality of posts extending outwardly from the gas component seating surface, the posts positioned in a spaced apart arrangement to mate with gas component coupling holes of a gas component to attach the gas component to the gas component seating surface.

12. A gas coupler according to claim 11 wherein the posts are threaded to engage threaded holes in the gas component seating surface.

13. A substrate processing apparatus comprising a substrate processing chamber having enclosed chamber walls, a substrate support, a gas distributor, and a gas exhaust, the gas distributor being capable of receiving a process gas from a gas pipe connected to the gas coupler of claim 9.

14. A gas coupler to conduct gas between a gas component, gas source and substrate processing chamber, the gas coupler comprising:
 (a) a unitary metal block comprising:
  (1) a gas component seating surface comprising first, second, and third gas component coupling ports, each gas component coupling port comprising a recessed inner ledge; and
  (2) first, second, third and fourth sidewall surfaces that are orthogonal to one another and at right angles to the gas component seating surface,
 wherein the first, second, and third sidewall surfaces comprise first, second and third counter-bored gas orifices, respectively; and
 wherein the fourth sidewall surface comprises a solid and continuous surface that is absent a counter-bored gas orifice; and
  (3) first, second and third internal passageways that each connect a single one of the first, second and third gas component coupling ports to a single one of the first, second and third counter-bored gas orifices, each internal passageway comprising an electropolished surface;
 (b) a plurality of posts extending outwardly from the gas component seating surface of the metal block, the posts positioned in a spaced apart arrangement suitable to mate with gas component coupling holes of gas components to attach the gas components to the gas component seating surface; and
 (c) at least one metal seal gasket on a recessed inner ledge of a gas component coupling port.

15. A substrate processing apparatus comprising a substrate processing chamber having enclosed chamber walls, a substrate support, a gas distributor, and a gas exhaust, the gas distributor being capable of receiving a process gas from a gas pipe connected to the gas coupler of claim 14.

16. A gas coupler according to claim 1 wherein each of the first, second, and third internal passageways comprises a right angle.

17. A gas coupler according to claim 9 wherein each of the first, second, and third internal passageways comprises a right angle.

18. A gas coupler according to claim 14 wherein each of the first, second, and third internal passageways comprises a right angle.

19. A gas coupler according to claim 9 wherein the unitary metal block comprises stainless steel.

20. A gas coupler according to claim 14 wherein the unitary metal block comprises stainless steel.

* * * * *